United States Patent

Huang et al.

[11] Patent Number: 6,156,655
[45] Date of Patent: Dec. 5, 2000

[54] RETARDATION LAYER FOR PREVENTING DIFFUSION OF METAL LAYER AND FABRICATION METHOD THEREOF

[75] Inventors: Ming-Ching Huang, Nantou Hsien; Chih-Rong Chen, Chupei; Kuai-Jung Ho, Hsinchu; Wen-Yuan Huang, Hsinchu Hsien; Chi-Chin Yeh, Hsinchu, all of Taiwan

[73] Assignees: United Microelectronics Corp.; United Semiconductor Corp., both of Hsinchu, Taiwan

[21] Appl. No.: 09/408,612

[22] Filed: Sep. 30, 1999

[51] Int. Cl.⁷ .................................................. H01L 21/44
[52] U.S. Cl. .......................... 438/687; 438/637; 438/638; 438/643; 438/647; 438/653; 438/657; 438/666; 438/672
[58] Field of Search .................................. 438/687, 637, 438/638, 643, 647, 653, 657, 666, 672

[56] References Cited

U.S. PATENT DOCUMENTS

| | | | |
|---|---|---|---|
| 5,893,752 | 4/1999 | Zhang et al. | 438/687 |
| 5,904,565 | 5/1999 | Nguyen et al. | 438/687 |
| 5,916,823 | 6/1999 | Lou et al. | 438/738 |
| 5,939,788 | 8/1999 | McTeer | 257/751 |
| 5,968,333 | 10/1999 | Nogami et al. | 438/687 |
| 5,969,422 | 10/1999 | Ting et al. | 438/687 |
| 6,017,817 | 1/2000 | Chung et al. | 438/637 |
| 6,037,664 | 3/2000 | Zhao et al. | 257/758 |

*Primary Examiner*—Richard Booth
*Assistant Examiner*—Lynne Gurley
*Attorney, Agent, or Firm*—Thomas, Kayden, Horstemeyer & Risley

[57] ABSTRACT

A retardation layer of a copper damascene process and the fabrication method thereof, to replace the conventional barrier layer with a laminated layer. The laminated layer combines the conventional barrier layer with a porous layer, wherein the porous layer can be formed either above or below the barrier layer to improve the retardation of the copper atom diffusion. Preferably, the porous layer is formed above the barrier layer.

8 Claims, 3 Drawing Sheets

RETARDATION LAYER FOR PREVENTING DIFFUSION OF METAL LAYER AND FABRICATION METHOD THEREOF

BACKGROUND OF THE INVENTION

1. Field of Invention

The present invention relates to a copper damascene process. More particularly, the present invention relates to a retardation layer for preventing copper diffusion and the fabrication method thereof, applicable to the fabrication method of a copper conducting wire.

2. Description of Related Art

In the conventional semiconductor device, a metal interconnect is made of aluminum or aluminum/copper alloy. It is known that copper has advantages, such as low resistance, high conductivity, low electron migration (EM), and so on, and is capable of being developed in the damascene process, so the future semiconductor process is developed in a direction where the metal interconnect is made of copper. As a result, the transmission speed of the device is increased, and the fabrication flow is simplified by applying the damascene process.

However, copper atoms may diffuse rather quickly in a silicon oxide layer, leading to a device failure or an inappropriate bridging between the metal interconnects. Although a conventional barrier layer (TiN/Ti or TaN/Ti) is used to retard the diffusion of copper atoms, such retardation effect is reduced by high temperature.

FIG. 1 is a schematic, cross-sectional diagram illustrating a conventional copper damascene manufactured with the barrier layer made of TiN/Ti. A part of the metal interconnect in the semiconductor device is shown in the diagram, wherein forming a tungsten plug 102 in a dielectric layer 100 provides an electrical coupling between an aluminum layer 104 and a device located below the tungsten plug 102. A copper conducting layer 106 is laid in an inter-metal dielectric (IMD) layer 108, while the barrier layer 110 made of TiN/Ti is formed between the IMD layer 108 and the copper conducting layer 106.

However, the barrier layer of the copper interconnect is usually made of TiN/Ti or TaN/Ti, as mentioned above, so it is limited in its ability to retard the diffusion of copper atoms. Under high temperature and long duration, the retarding effect may still be poor. Thus, this causes a device failure.

SUMMARY OF THE INVENTION

The invention provides a retardation layer of a copper damascene process and fabrication method thereof, which provides a retardation layer with excellent retardation is provided to limit the diffusion of copper atoms in the silicon oxide layer.

As embodied and broadly described herein, the invention provides a retardation layer of the copper damascene process, wherein the retardation layer comprises a laminated layer to replace the conventional barrier layer. The laminated layer is composed of a stack made up of a conventional barrier layer and a porous layer. The retardation effect in this case is improved whether the porous layer is formed above or below the barrier layer. Preferably, the arrangement order is copper conducting layer/barrier layer/porous layer.

According to a preferred embodiment, a retardation layer of the copper damascene process is provided, in which a laminated layer is formed to replace the conventional barrier layer. The laminated layer comprises at least a porous layer and a barrier layer, wherein the porous layer includes a porous silicon layer.

According to the preferred embodiment of the invention, a method for fabricating the retardation layer of the copper damascene is provided. The porous layer in this case includes a porous silicon layer, while the method for forming the porous layer involves forming a polysilicon layer, followed by etching so as to form the porous silicon layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIG. 2A to FIG. 2E are schematic, cross-sectional diagrams illustrating the fabrication steps of the copper damascene according to one preferred embodiment of this invention.

Figure 1:
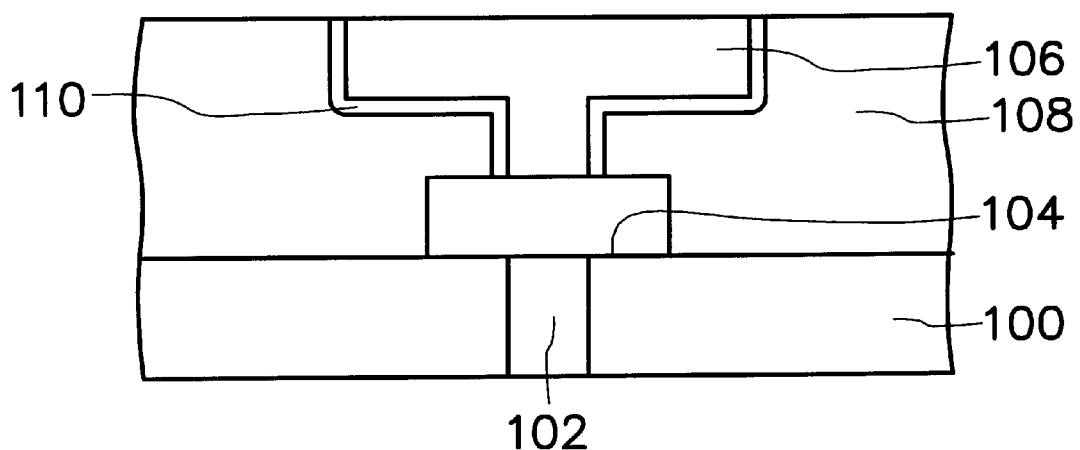
FIG. 1 is a schematic, cross-sectional diagram illustrating a conventional copper damascene manufactured with the barrier layer made of TiN/Ti.
Figure 2A:
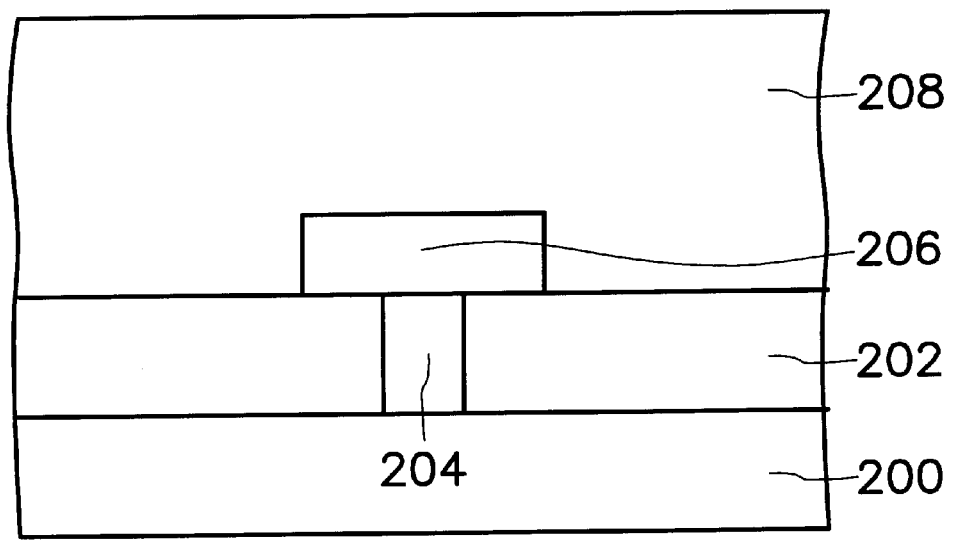
FIG. 2A to FIG. 2E are schematic, cross-sectional diagrams illustrating the fabrication steps of a copper damascene according to one preferred embodiment of this invention.

Referring to FIG. 2A, asubstrate 200 is provided with an inner dielectric layer 202 formed thereon. A first metal interconnect 206 is formed on the inner dielectric layer 202 and couples via a metal plug 204 which is located below the first metal interconnect 206 to a semiconductor device (not shown) above the substrate 200. In this embodiment, the first metal interconnect 206 and the metal plug 204 may include aluminum and tungsten, respectively. Alternatively, other conducting materials are also applicable.

A first inter-metal dielectric (IMD) layer 208 is formed to cover the first metal interconnect 206 and the inner dielectric layer 202, wherein th, first IMD layer 208 includes silicon oxide, and the method for forming the first IMD layer involves a process, such as chemical vapor deposition (CVD).

Figure 2B:
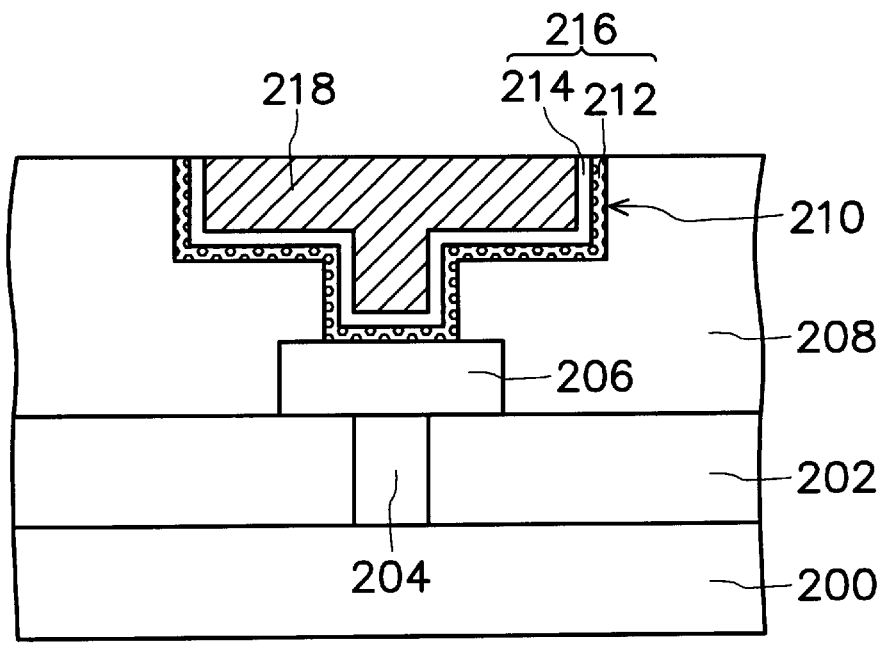

Referring to FIG. 2B, the first IMD layer 208 is patterned by conventional photolithography and etching to form an opening 210 therein. The opening 210 in this case may be a trench, a via, or a contact. A laminated layer 216 is then formed to cover a profile of the opening 210 and the first IMD layer 208, wherein the laminated layer 216 is conformal to the profile of the opening 210.

It is noted that the laminated layer 216 is composed of a barrier layer 214 and a porous layer 212. The barrier layer 214 includes TiN/Ti, while the method for forming the barrier layer 214 involves a process such as conventional sputtering or CVD. The porous layer 212 includes porous silicon, while the method for forming the porous layer 212 involves forming a polysilicon layer by CVD, followed by etching the polysilicon layer to yield the porous silicon layer. Since copper can react with porous silicon at room temperature to form copper silicide, such property allows porous silicon to trap copper atoms, thus solving the problem where copper atoms in silicon dioxide continue to diffuse outward.

The porous layer 212 may be formed either above or below the barrier layer 214 to improve the retardation of the copper atom diffusion. Preferably, the porous layer 212 is located below the barrier layer 214, i.e., the barrier layer is between the porous layer 212 and subsequently formed copper layer.

By following the arrangement order given above (copper conducting line/barrier layer/porous layer), copper atoms need to pass through the barrier layer 214 before contacting with the porous layer 212. Since only a few copper atoms can diffuse through the barrier layer 214, those that do pass through the barrier layer contact with the porous layer 212 and are completely trapped within to form metal silicide. In contrast, when the other possible arrangement order (copper conducting line/porous layer/barrier layer) is followed, copper atoms initially contact with the porous layer 212. However, the porous layer 212 may be saturated with copper atoms to form copper silicide after a length of time, so that some copper atoms may still diffuse through the porous layer 212. As the barrier layer 214 shows poor retardation for diffusion, the result obtained from the arrangement order in the example (copper conducting line/barrier layer/porous layer) is better and preferred here.

Referring to FIG. 2B again, a metal layer 218 is formed on the laminated layer 216 to fill the opening 210. The metal layer 218 includes copper, while the method for forming the metal layer 218 includes a process such as sputtering. A part of the metal layer 218 and the laminated layer 216 outside the opening 210 is removed to form a second metal interconnect. The metal layer 218 and the laminated layer 216 as described above are removed by, for example, a process such as chemical mechanical polishing (CMP).

Figure 2C:
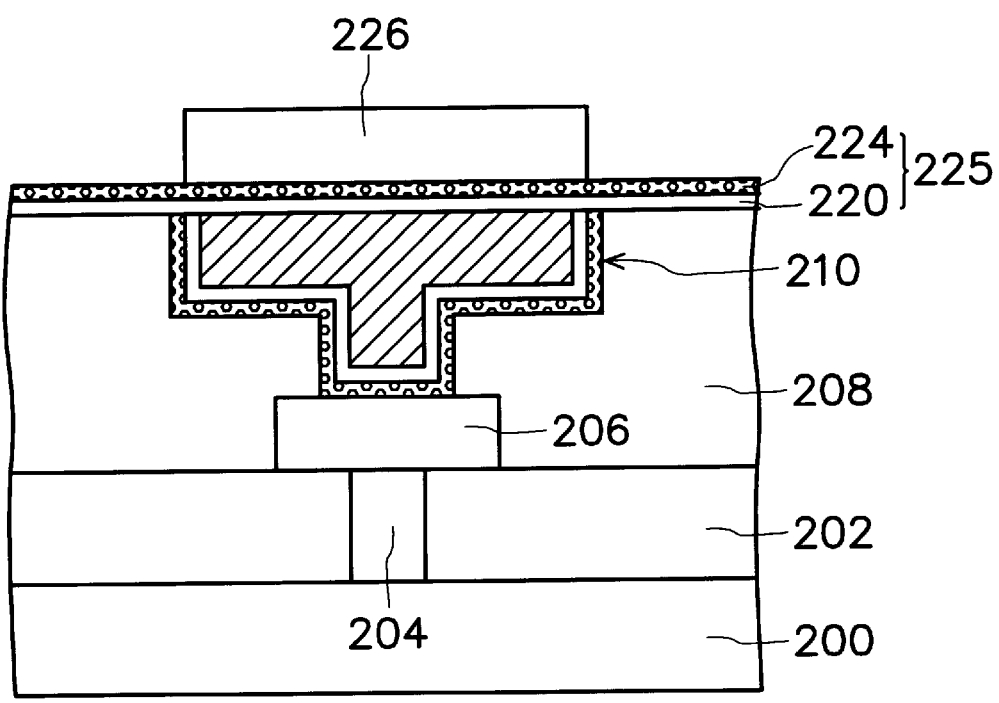

Referring to FIG. 2C, another laminated layer 225 is formned to completely cover the metal layer 218, and the first IMD layer 208, wherein the laminated layer 225 is the same as the laminated layer 216 mentioned above. The laminated layer 225 is composed of a barrier layer 220 and a porous layer 224, while the barrier layer 220 and the porous layer 224 are preferably formed with the order of arrangement given as copper layer/barrier layer/porous layer.

Figure 2D:
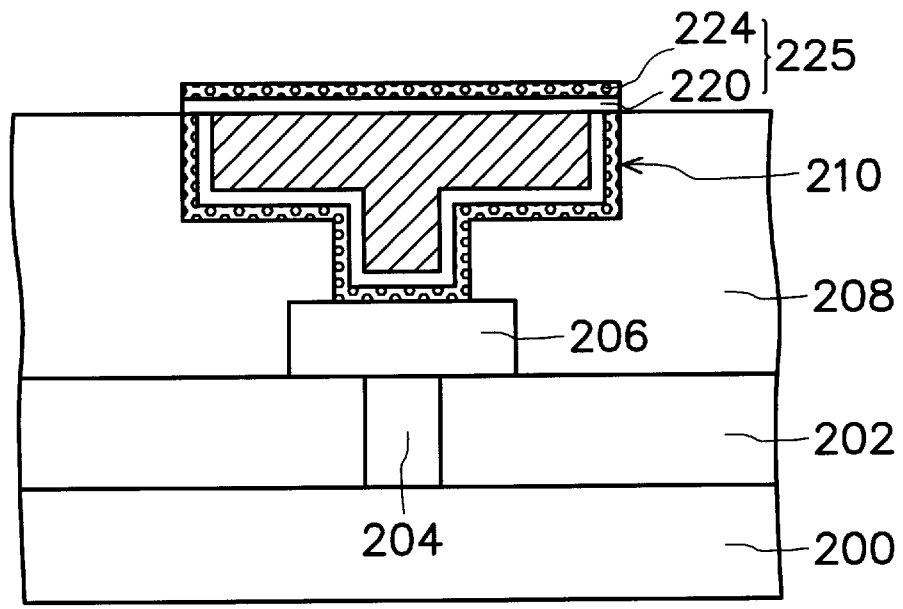

Referring to both FIG. 2C and FIG. 2D, a patterned mask 226 corresponding to the metal layer 218 is formed by conventional photolithography on the laminated layer 225, wherein the patterned mask 226 includes a photoresist layer. With the pattern mask 226 serving as an etching mask, the laminated layer 225 not covered by the patterned mask 226 is removed.

Figure 2E:
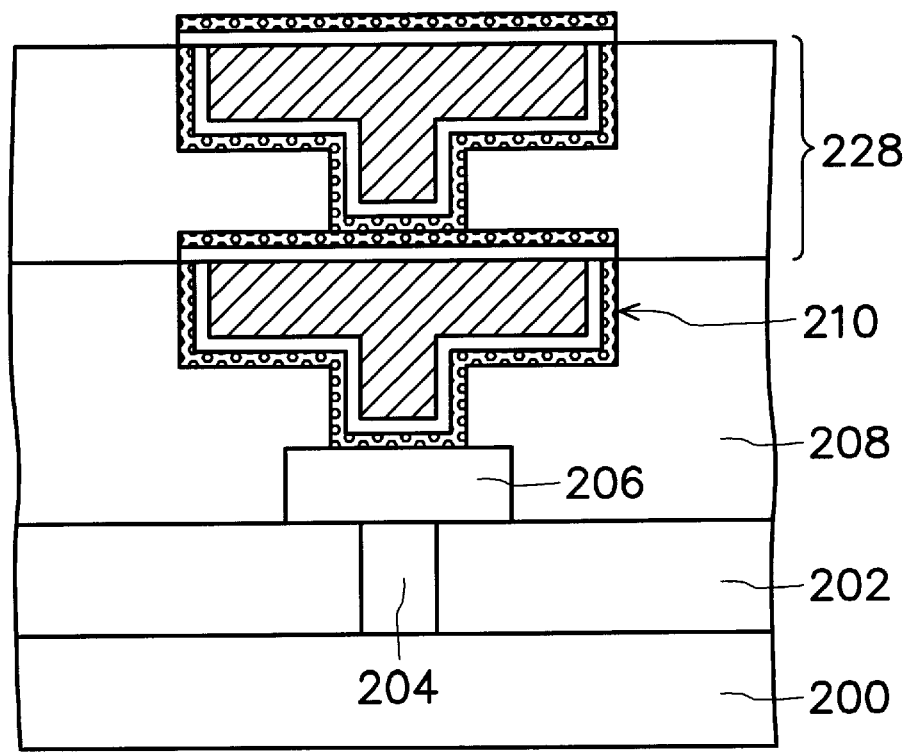

Reference is made to FIG. 2E, in which the fabrication steps illustrated in FIG. 2A to FIG. 2D are repeated to form a third metal interconnect.

According to the present invention, a porous silicon layer, which serves as a retardation layer, is used to improve the retardation for the copper diffusion. Alternatively, other non-silicon, porous materials are also applicable as long as they have a porous property to reduce the copper diffusion.

Summarizing the above, it is understood that a laminated layer having porous silicon to replace the conventional barrier layer is disclosed in the invention. Since copper atoms react with porous silicon at room temperature to form copper silicide, this property allows the porous silicon layer to trap copper atoms, thus solving the problem where copper atoms in silicon dioxide continue to diffuse outward. Meanwhile, the problem of copper peeling is improved due to the excellent adhesion provided between porous silicon and silicon dioxide.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a retardation layer which prevents copper diffusion, applicable to a semiconductor process, comprising steps of:

providing a substrate with a first metal line formed thereon;

depositing a dielectric layer on the substrate to cover the first metal line;

forming an opening in the dielectric layer;

forming a first laminated layer to cover a profile of the opening and the dielectric layer, wherein the first laminated layer is conformal to the profile of the opening;

forming a copper layer on the laminated layer for filling the opening;

removing the copper layer and the laminated layer outside the opening so as to form a copper damascene;

forming a second laminated layer to completely cover the copper layer and the dielectric layer.

2. The fabrication method of claim 1, wherein the laminated layer includes a porous layer and a barrier layer.

3. The fabrication method of claim 2, wherein the porous, layer includes a porous silicon layer.

4. The fabrication method of claim 3, wherein the method for forming the porous silicon layer comprising steps of:

forming a polysilicon layer; and etching the polysilicon layer for forming the porous silicon layer.

5. The fabrication method of claim 2, wherein the porous layer is formed between the copper line and the barrier layer.

6. The fabrication method of claim 2, wherein the barrier layer is formed between the copper line and the porous layer.

7. The fabrication method of claim 1, wherein the copper line includes a copper damascene.

8. The fabrication method of claim 1, wherein the dielectric layer includes a inter-metal dielectric layer.

* * * * *